United States Patent
Rauschnabel et al.

(10) Patent No.: US 6,613,393 B1
(45) Date of Patent: *Sep. 2, 2003

(54) METHOD FOR APPLYING A WEAR PROTECTION LAYER SYSTEM HAVING OPTICAL PROPERTIES ONTO SURFACES

(75) Inventors: Johannes Rauschnabel, Stuttgart (DE); Johannes Voigt, Leonberg (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/701,539

(22) PCT Filed: May 4, 1999

(86) PCT No.: PCT/DE99/01326

§ 371 (c)(1), (2), (4) Date: Mar. 1, 2001

(87) PCT Pub. No.: WO99/63129

PCT Pub. Date: Dec. 9, 1999

(30) Foreign Application Priority Data

May 30, 1998 (DE) .......................................... 198 24 364

(51) Int. Cl.[7] .................................................. H05H 1/00
(52) U.S. Cl. ...................... 427/488; 427/489; 427/509; 427/515; 427/535; 427/162; 204/192.12; 204/192.26
(58) Field of Search ................................ 427/578, 488, 427/489, 492, 509, 515, 535, 162; 204/192.12, 192.26

(56) References Cited

U.S. PATENT DOCUMENTS

| 4,619,865 | A | | 10/1986 | Keem et al. |
| 4,830,873 | A | | 5/1989 | Benz et al. |
| 4,883,686 | A | * | 11/1989 | Doehler et al. .............. 427/562 |
| 5,002,794 | A | * | 3/1991 | Ratner et al. ................ 427/488 |
| 5,242,740 | A | | 9/1993 | Rostaing et al. |
| 5,363,400 | A | * | 11/1994 | Damond et al. ........ 204/298.41 |
| 5,837,331 | A | * | 11/1998 | Menu et al. ................. 427/569 |
| 5,846,608 | A | * | 12/1998 | Neumann et al. ........... 427/529 |
| 6,044,792 | A | * | 4/2000 | Ogawa et al. ........... 118/723 E |
| 6,287,642 | B1 | * | 9/2001 | Leutsch et al. .............. 427/536 |

FOREIGN PATENT DOCUMENTS

| EP | 0801146 A1 | * | 10/1997 |
| JP | 56147829 | | 11/1981 |
| JP | 61073881 | | 4/1986 |
| JP | 02129375 | | 5/1990 |
| JP | 03120519 | | 5/1991 |
| JP | 07016451 | | 1/1995 |
| JP | 07153071 | | 6/1995 |

OTHER PUBLICATIONS

Fracassi, F. et al., "Plasma–assisted deposition of tungsten-–containing siloxane thin films". Thin Solid Films (264) pp. 40–45, 1995.*

Fracassi et al., "Plasma–Assisted Deposition of Tungsten-–Containing Siloxane Thin Films", vol. 264, No. 1, Aug. 1, 1995, pp. 40–45.

* cited by examiner

*Primary Examiner*—Bret Chen
(74) *Attorney, Agent, or Firm*—Kenyon & Kenyon

(57) ABSTRACT

A method for applying wear protection layers including the steps of depositing a wear protection matrix with the aid of a PECVD method, and incorporating optically functional inclusions in the form of particles or intermediate layers with the aid of a PVD process. The chemistry of the inclusion is influenced by the process gas of the PECVD deposition and/or the matrix layer. In an example embodiment of the present invention, the optical functionality consists in UV protection of plastics by dispersion, absorption, or reflection of the UV component of the light.

24 Claims, 3 Drawing Sheets

METHOD FOR APPLYING A WEAR PROTECTION LAYER SYSTEM HAVING OPTICAL PROPERTIES ONTO SURFACES

FIELD OF THE INVENTION

The present invention relates to a method for applying multiple-ply wear protection layers having optical properties onto surfaces.

BACKGROUND INFORMATION

It is conventional to apply layers onto substrates using various techniques, for example laser polymerization, reactive sputtering, or electroplating. U.S. Pat. No. 4,830,873 describes an application of thin transparent layers onto the surface of optical elements by plasma polymerization of silicon initial compounds. The polysiloxane layers thereby created are very hard and transparent. U.S. Pat. No. 4,619,865 describes a method for applying wear protection layers, in particular multiple-ply protective layers, by way of magnetron sputtering. Each layer has a different hardness or abrasion resistance. Different layer properties can also be combined with one another in these multiple-ply layers; for example, one layer acts as a diffusion barrier for water vapor, the second layer is extremely hard, and the third layer can, for example, be electrically insulating.

The problem of imparting sufficient wear resistance to substrates other than steel, ceramic, or glass—especially plastics—has not, however, hitherto been satisfactorily solved. For example, if plastics are to be mechanically loaded, it is thus necessary, for example, to equip molded plastic parts with wear protection coatings. For this purpose, it is known that in addition to the application of a scratch-proof protective varnish layer. It is also possible to apply, for example, wear-resistant polysiloxane layers by plasma polymerization. Often, however, because of the substrate used for example, polycarbonate, it is necessary to make the wear protection layer UV-resistant by way of suitable additives, so that the uppermost plastic layer does not break down when exposed to outdoor weathering and thus degrade the adhesion of the wear protection layer. To prevent this, a UV absorber, for example, is dissolved in the varnish. This is intended, after the varnish has cured, to protect the substrate from the effect of light. Varnishes are not wear-resistant on a long-term basis.

SUMMARY OF THE INVENTION

An object of the present invention is to develop a method of combining incorporated or multiple-ply layers that possess optical properties, in particular UV properties such as resistance to and absorption or reflection of UV radiation, with high wear resistance on substrates, in particular substrates that can degrade upon weathering, for example, plastic components.

The present invention provides a method for applying protective layers having optical properties, for example, having good UV protective functions, onto surfaces by way of at least two different deposition steps. One step comprises a plasma-enhanced Chemical Vapor Deposition ("CVD") method, and the at least one other step compromises a material deposition using the Physical Vapor Deposition ("PVD") technique. Combining these methods in one vacuum vessel greatly decreases capital costs. Coating times can be further reduced by operating the two deposition processes simultaneously, which can result in an additional cost decrease. Deposition of the wear protection layer can be performed by plasma polymerization. Plasma polymerization is a coating method in which an evaporable chemical compound, for example, an aliphatic-aromatic or olefinic hydrocarbon compound, preferably methane, ethane, ethylene, or acetylene, is used. It is preferable to use a silicon-organic compound including the elements silicon, carbon, and hydrogen, or with additional nitrogen and/or oxygen, may include tetramethylsilane (TMS), hexamethyldisilane (HMDS), hexamethyldisilazane (HMDS(N)), tetraorthosilicate (TEOS), dimethyldiethoxysilane (DMDEOS), methyltrimethoxysilane (MTMOS), tetramethyldisiloxane (TMDS(O)), divinyltetramethyldisiloxane (VSI2), and very particularly advantageously hexamethyldisiloxane (HMDS(O)). These "monomers"—many of which cannot be polymerized by conventional chemical methods—can have further evaporable additives mixed into them, for example metalorganic compounds such as tetraethyl orthotitanate (TEOT), tetraisopropyl orthotitanate (TIPOT), or tetrakis(dimethylamino)titanium.

In another embodiment of the present invention, halogenated additives such as tetrafluoromethane, chloroform, or freons can be used. The monomer/additive mixture is then exposed in the vessel to an electric field that can be capable of igniting a plasma of the vapor. The vapor molecules are thereby activated and fragmented into ions and radicals. These highly reactive fragments condense onto the substrate surface and combine into a new, very dense monomer network. In order to prevent the electrodes necessary for the electric field from becoming insulated with insulating layers, which can occur, for example, when silicon-containing vapors are used, it is recommended to power the plasma with electrical high-frequency fields in a frequency range between 50 kHz and 2.45 GHz, preferably between 400 kHz and 2.45 GHz. Because of the higher deposition rate, it is particularly advantageous to use radio-frequency (13.56 MHz) or microwave radiation (2.45 GHz). Microwave plasmas can be operated in pulsed or unpulsed fashion, with or without magnetic field enhancement (ECR). The pulse frequencies can be between a few Hz and 10 kHz, preferably in the range between 50 Hz and 2 kHz; the pulse-to-interpulse ratio can be set without restriction.

In another embodiment of the present invention, in the case of a microwave plasma the chemical structure and stoichiometry of the deposited layer can be more freely adjusted by physically separating the plasma from the deposition region, since fragmentation of the monomer molecules proceeds more gently and more controllably.

In another embodiment of the present invention, this can be achieved by "remote placement," in which a noble gas and/or a non-coating gas, which can be called the "reactive gas", e.g., oxygen, nitrogen, hydrogen, ammonia, laughing gas, halogen, is activated and fragmented in the source and/or in the vicinity of the source, and passes by way of a correspondingly guided gas flow toward the substrate. At that point the activated reactive gas encounters the monomer gas, causing the monomer gas to be activated and fragmented. This embodiment of the present invention provides better control of thermal loads, e.g., in the case of microwave-absorbing materials such as plastics, since the source and the point of highest plasma density is located farther away from the substrate.

In a further embodiment of the present invention, deposited polymer networks can be additionally densified by substrate heating and/or ion bombardment. Since additional heating can have limitations in the case of temperature-sensitive substances, e.g., plastic materials, ion bombardment is useful because densification, rearrangement of bonds in the network in the direction of maximum bond saturation of the atoms participating in the network, can be combined with a comparatively small heat input. A further embodiment of the present invention provides using a bias voltage on the substrate by way of an electrode mounted behind the substrate. This allows pulling ions directly onto the substrate. Both pulsed and unpulsed bias voltages can be used in this context. In the case of pulsing, frequencies between 5 kHz and 27 MHz are usable, in particular between 10 kHz and 13.56 MHz. Bias voltages can be used in addition to the PECVD process, i.e., microwave plasma polymerization. In another embodiment of the present invention, bias voltages can also be utilized as the only source for Plasma Enhanced Chemical Vapor Deposition ("PECVD") deposition of the wear protection layer. High-frequency bias voltages have proven particularly effective in this context, in particular those with frequencies in the range of 50 kHz to 800 kHz or 13.56 MHz.

Particular optical properties, in particular UV protection, can be implemented in three ways: first, by way of a package of thin layers having different refractive indices that are capable of reflecting UV light; second, by way of an absorption layer in which the UV light is absorbed and converted into other forms of energy; and third, by the incorporation of atomic or molecular "clusters" whose size and concentration in the matrix are selected in such a way that UV radiation can effectively interact with said clusters.

The UV protection function can be implemented by way of metal compounds and, in the case of clusters, also by pure metals. These can be integrated into the wear protection layer as particles, phases, or intermediate layers, e.g. also in the form of multiple-ply layer packages. This is achieved with the aid of a sputtering method, in which there is clamped in front of the cathode a metallic or nonmetallic target from whose surface successive atoms, atom clusters, and particles are evaporated or sputtered by way of ions accelerated in the direction of the cathode. DC magnetron sputtering, pulsed magnetron sputtering, double-cathode sputtering, or high-frequency sputtering can be used for the purpose.

When insulating target materials, e.g., oxides, are used, the use of a bipolar-pulsed double cathode is particularly suitable for integrating the UV protective function in accordance with the present invention. The use of this technique is also particularly advantageous in view of the fact that dielectric wear protection layers created in the PECVD process can also be deposited onto the cathode target, forming there an insulating coating that can gradually reduce the sputtering rate to zero ("target poisoning"). When bipolar-pulsed double cathodes are operated, this coating can be sputtered off again by the alternating polarity reversal of the individual cathodes, thus preventing any permanent poisoning of the target.

In a further embodiment of the present invention, a hollow cathode is used. Because of the continuous gas flow that is guided out of the hollow cathode, any coating of the target (which is mounted inside the hollow cathode) can be difficult or not possible.

In another embodiment of the present invention, oxides, silicides, carbides, borides, nitrides, sulfides, fluorides, selenides, and tellurides of the elements of the fourth through sixth subgroup, and of the elements La, Ce, Zn, In, Sn, Al, Si, Ge, Sb, Bi, and/or mixtures thereof, are used for sputtering the UV protective layer. As a result, not only metallic but also oxide, silicide, fluoride, selenide, and/or telluride inclusions can be integrated into the layer system.

Deposition by way of a magnetron sputtering technique of the optically active materials that are to be incorporated can, according to the present invention, be accomplished either in that targets made of elements, (e.g., titanium, zinc, or silicon (see above), alloys e.g., Al—Mg—Si or Zr—Al, or corresponding compounds, e.g., TiO, ZnS, SiO, etc., can be atomized with the aid of noble gases e.g., argon, and reacted only later in the PECVD process atmosphere to form the compounds of desired stoichiometry; or sputtering is performed directly with the gas with which the chemical reaction is to take place (the "reactive gas"), in which context the process must be very accurately controlled, e.g., by way of plasma emission monitoring, because of the risk of poisoning. In this embodiment, a defined post-reaction in the atmosphere of the PECVD process can established.

The post-reaction can be established using process parameters such as the mean free path ratio of the particles between impacts with the reactive gas or vapor molecules, defined by the process pressure, the power input into the PECVD and PVD process, or the target-substrate distance.

Non-coating gases such as, for example, oxygen, hydrogen, diborane, nitrogen, laughing gas, ammonia, nitrogen trifluoride, hydrogen sulfide, and/or fluoride, can be used as reactive gases. Coating gases, for example, hydrocarbons, boron-organic compounds, and halogenated hydrocarbons, can also be used for the post-reaction; they are utilized not as sputtering and reactive gases but as monomers.

In order to establish the chemical composition of the layer accurately and to improve the control of target poisoning, in an embodiment the gas with which the targets are to be sputtered (the "sputtering gas") is introduced directly onto the cathodes, while the reaction gas is delivered at a defined distance from the target. This is implemented most easily by way of separate gas supply lines called e.g., gas frames.

In the event that particles are to be incorporated, the size thereof can be established by way of the target/substrate distance and the gas pressure.

A method according to an embodiment of the present invention can be performed in such a way that the two steps are accomplished simultaneously. The result is to create at least one layer having the desired optical and wear-protection properties, in which context the UV protection applied by sputtering can be incorporated homogeneously into the wear protection layer. The chemistry of the incorporated molecules, particles, or plies is influenced by reactions with the reactive gas and/or molecules, fragments, or atoms of the monomer vapor from the PECVD process. Reactions in the deposited layer also exist. For example, sputtered atoms, clusters, or particles of oxidation-sensitive elements or compounds such as aluminum are oxidized, at the latest upon incorporation into a siloxane plasma polymer layer. If a sufficient concentration of monomer vapor is still present in the process gas, the reaction will then, as described, take place even before striking the layer. A central constituent of the method according to the present invention is this mutual chemical influence between the PECVD and PVD methods, which is particularly pronounced when the processes are simultaneous.

Another embodiment of the present invention involves performing facility that is not subdivided, the reactive components of the sputtering process then deriving, as described above, for the most part from the monomer vapor of the plasma polymerization.

Another embodiment of the present invention provides using multiple steps performed in succession (reactive sputtering, plasma polymerization, reactive sputtering, etc.) to more accurately adjust the composition of the layer component that is deposited by sputtering, provided the cathode shutter is closed during the plasma polymerization process so that the cathode targets cannot become coated with plasma polymer. A rather layered distribution of the incorporated species in the matrix can result from the method of the present invention.

In another embodiment of the present invention, a somewhat grater separation between the process gas atmospheres can be achieved by the fact that between the PVD and PECVD processes, the chamber is pumped down, noble gas is admitted, the chamber is pumped down again, and only then is the monomer admitted.

One process and system variant according to the present invention is a vacuum chamber that is equipped with a compartmentalization of the process regions within the vacuum chamber, without airlock technology but with, for example, sheet-metal panels and corresponding management of fresh gas and exhaust gas flows. This also results in a somewhat greater separation of the various processes, allowing controlled adaptation to the desired stoichiometry of the PVD deposition.

In another embodiment of the present invention, a multiple-ply layer structure for the wear protection matrix can also be deliberately selected in order to achieve extreme wear resistance with good homogeneity and excellent UV protection properties, for example, reflection of critical UV wavelengths at the multiple-ply package.

In order to prevent discoloration and maximize reflectivity, layers with an accurately defined thickness, good thickness homogeneity, and alternatingly high and low refractive indices are necessary in this context. The matrix contributes to wear protection with its hardness, and to the interference layer package with its refractive index.

In another embodiment of the present invention, involving soft substrate materials, for example, plastic, a soft matrix base layer is deposited, whose hardness is continuously increased as the layer thickness grows. The individual plies of the reflection layer package are incorporated into this. The overall layer package terminates at the top in an extremely wear-resistant surface layer.

In another embodiment of the present invention, the wear protection matrix can also be deposited in such a way that the adaptation in terms of hardness and elasticity to the substrate and wear load is accomplished in steps. This results in a multiple-ply layer package. In this context, the optical functional material can also be deposited in individual layers.

In the case of a UV-reflective layer package that is to be integrated into a multiple-ply wear protection matrix, it is useful if the individual wear protection layers are optimized not only in terms of their hardness and elasticity, but also in terms of their refractive index. As a result, the wear protection matrix can assume optical functionality in the context of the interference layer package.

In another embodiment of the present invention in which particles are incorporated into the matrix, it is possible to integrate them into the matrix in a concentration, morphology, and/or stoichiometry gradient. For that purpose, the sputtering parameters and/or reactive gas parameters are continuously modified during the PVD process. Especially in combination with a hardness gradient of the wear protection layer, particle incorporation gradients of this kind can be used for optical layers.

The thickness of the combination layer and the concentration of the optical functional materials are established by way of the duration of the deposition process, pressure, flow conditions, and irradiated energy.

DETAILED DESCRIPTION

Figure 1:
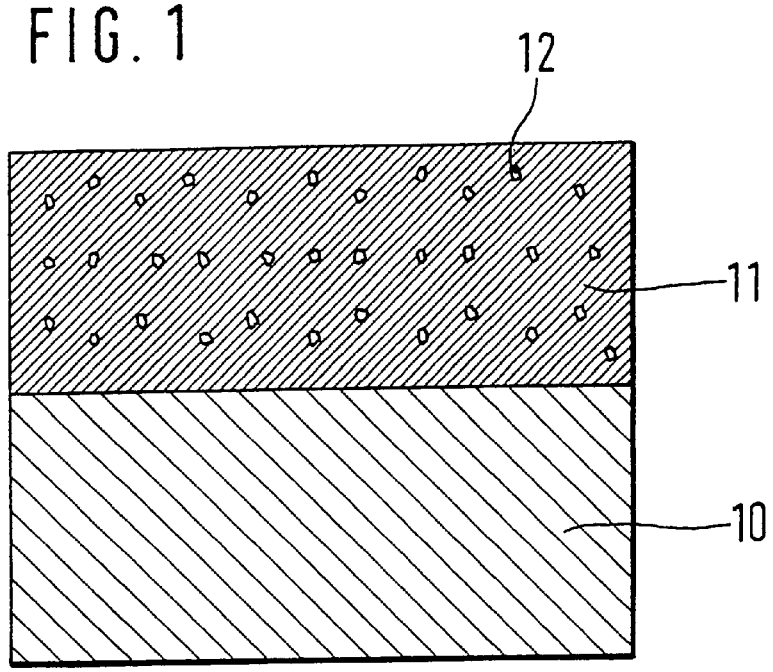
FIG. 1 shows an embodiment of the present invention having a layer structure on a substrate when the sputtering and microwave sources are operated simultaneously.

FIG. 1 shows an embodiment of the present invention having a layer structure in the case of simultaneous operation of the sputtering and microwave sources. A layer comprising two components is applied onto a substrate 10 that is made, for example, of polycarbonate, PVC, polyethylene, or another plastic, or onto another substrate. The one component 11, which constitutes the layer matrix, is a wear protection layer made of polysiloxane applied by plasma polymerization. Introduced as UV protection into this layer 11 by sputtering, e.g., reactive double-cathode sputtering, are metal compound particles 12 that are made, for example, of zinc sulfide, titanium dioxide, cerium dioxide, or the like. Particles 12 are homogeneously introduced into wear protection layer 11.

Figure 2:
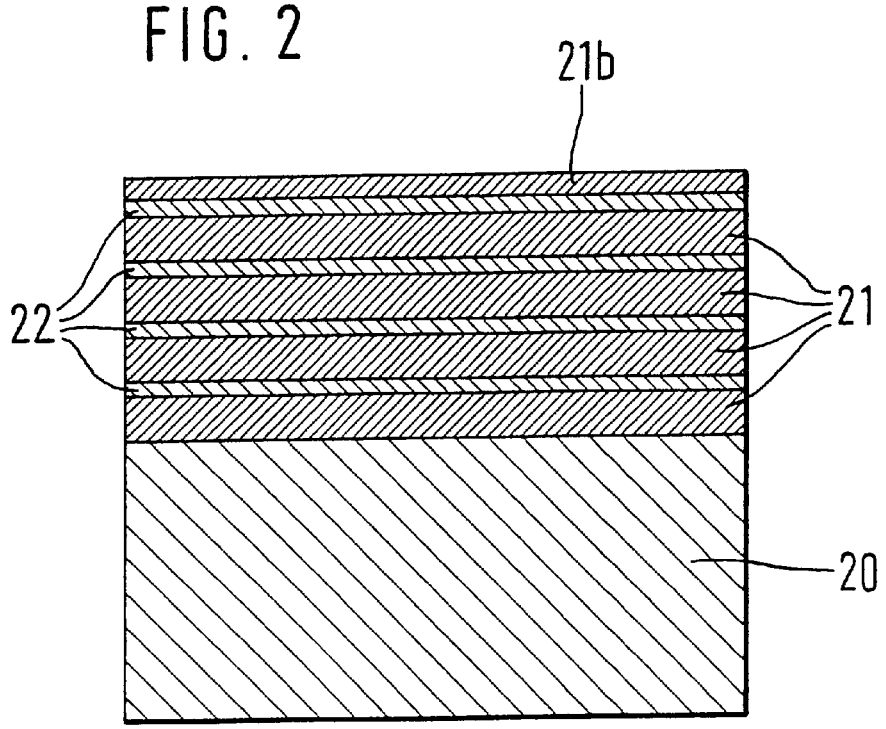
FIG. 2 shows an embodiment of the present invention having a layer structure when the sputtering and microwave sources are operated alternatingly.

FIG. 2 shows an embodiment of the present invention having a layer structure on a substrate 20 also made, for example, of polycarbonate, polyethylene, etc. Layers 22 made of the sputtered metal compound and further polysiloxane layers 21 are applied alternatingly onto layer 21 made of a polysiloxane layer applied by plasma polymerization. A wear-resistant surface layer forms the termination toward the tribological contact. Layers 22 are incorporated into the matrix layer. With this layer package made up of alternating layers 21 and 22, which can have very different refractive indices, it is possible for reflection of critical wavelengths of electromagnetic radiation to occur by interference at this multi-layer package.

Figure 3:
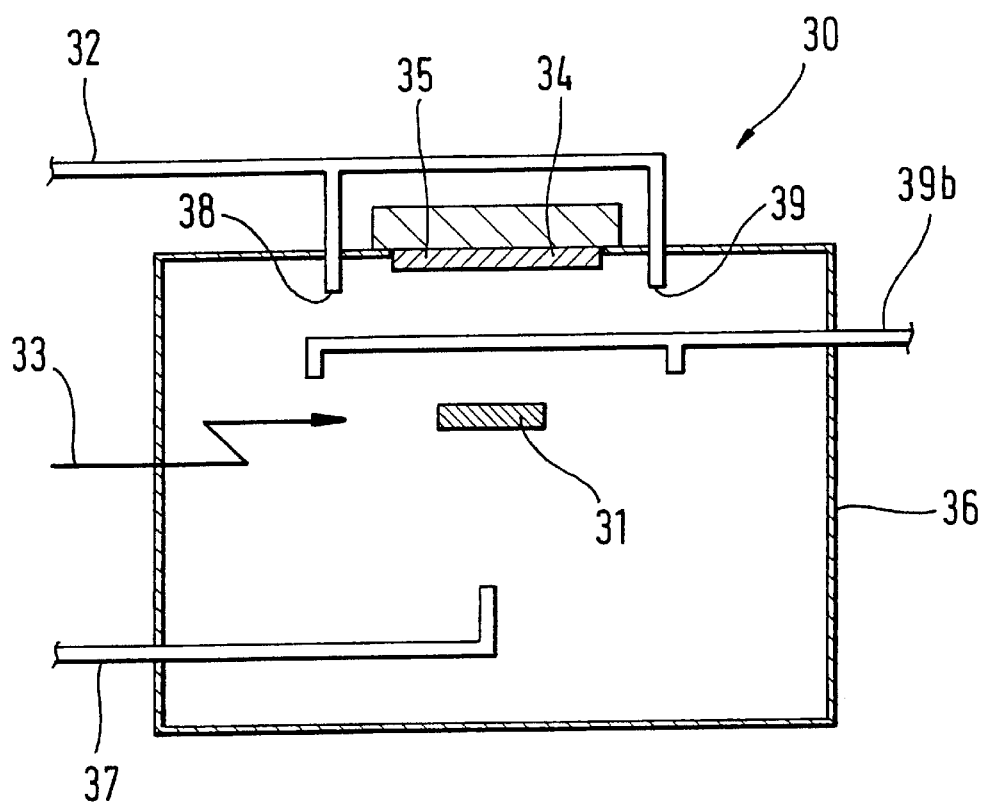
FIG. 3 shows an apparatus for carrying out the method according to the present invention.

FIG. 3 shows an apparatus for carrying out the method according to the present invention, this is a single-chamber facility with separate gas delivery is described. Apparatus 30 comprises a chamber 36 in which the reaction takes place. Arranged in this chamber, on a support that is not depicted, is a substrate 31. A supply line 37 for the silicon monomer gas is arranged on the one side of chamber 36. Arranged opposite supply line 37 for the silicon monomer gas is supply line 32 for the sputtering gas. Arranged between the two openings 38 and 39 that lead from supply line 32 for the sputtering gas into reaction chamber 36 is a cathode 34, connected to a voltage source (not depicted), on which target 35, made of the compound to be sputtered, is in turn arranged. In addition, a reactive gas can be admitted into the chamber through reactive gas supply line 39b. A microwave generator 33 that generates the plasma is mounted in the vicinity of the substrate.

Figure 4:
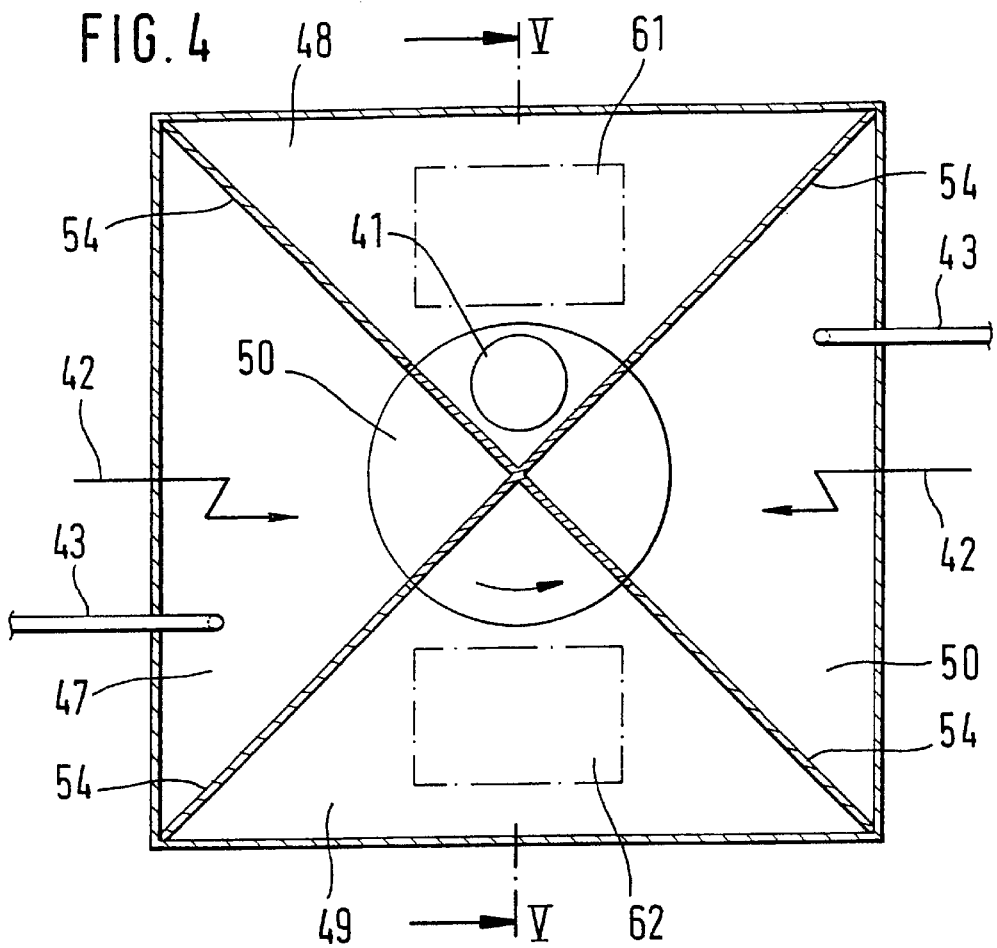
FIG. 4 shows a multi-chamber apparatus for carrying out the method according to the present invention.
Figure 5:
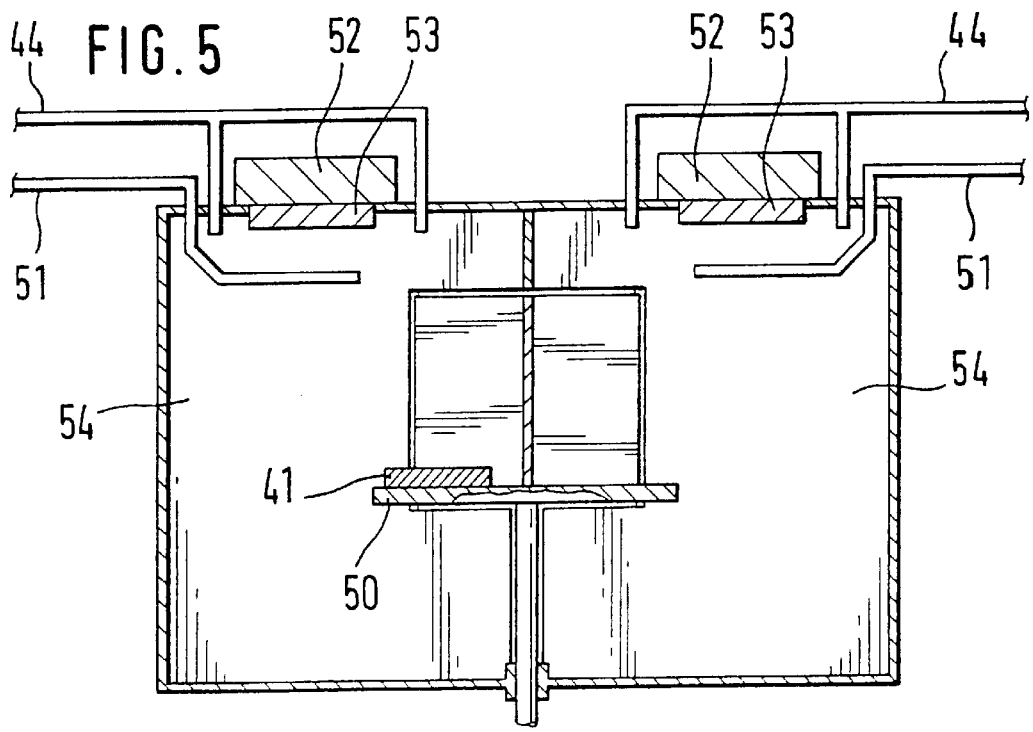
FIG. 5 shows a section along line V—V through the apparatus according to FIG. 4.

FIGS. 4 and 5 depict a further apparatus for carrying out the method according to the present invention. This is a multi-chamber facility with compartmentalization. The apparatus comprises four chamber regions 47, 48, 49, and 50 separated by partition panels 54. Mounted respectively in the first and second reaction regions 47, 50 is a PECVD source 42, e.g., a microwave antenna with associated power supply, together with a respective supply conduit 43 for the silicon monomer. In the drawing, a substrate 41 is arranged in the second chamber compartment 48. Reactive sputtering takes place in compartments 48 and 49, a first sputtering system 61 being arranged in compartment 48, and a second sputtering system 62 in compartment 49. Sputtering systems 61, 62 each have a cathode 52. A target 53 is clamped onto each of cathodes 52. Gas is supplied to compartments 47, 48 through respective supply conduits 44 for the sputtering gas and respective supply conduits 51 optionally for a reactive gas. Substrate 41 is transported from compartment to compartment by a turntable 60 that also has partition panels in order to ensure partial separation of the process gas atmospheres in the individual compartments 47, 48, 49, and 50. Once sputter-coating has been performed, substrate 41 is transferred with the gas, in the plasma, that is to be coated. After each reaction step, the substrate is transferred into the respective other chamber until the desired multiple-ply structure has been attained on the substrate.

What is claimed is:

1. A method for applying at least one wear protection layer having optical properties onto a substrate, comprising:

depositing a wear protection matrix onto the substrate using a plasma-enhanced chemical vapor deposition process;

effecting a material deposition onto the substrate using a physical vapor deposition technique to incorporate at least one optically functional material into the wear protection matrix providing a resultant surface layer; and arranging a plurality of bonds in the at least one wear protection layer in a direction of a maximum bond saturation of a plurality of atoms participating in the at least one wear protection layer by intermittently applying a bias voltage to the substrate, the bias voltage increasing an ion bombardment of the surface layer.

2. The method according to claim 1, further comprising the step of:

chemically influencing the material deposition by at least one of the plasma-enhanced chemical vapor deposition process and the wear protection matrix.

3. The method as defined in claim 1, further comprising the step of:

performing the depositing step and the effecting step in one reaction chamber.

4. The method as defined in claim 1, wherein the plasma-enhanced chemical vapor deposition process is a plasma polymerization.

5. The method as defined in claim 1, wherein the plasma of the plasma-enhanced chemical vapor deposition process contains at least one of a hydrocarbon compound and a silicon compound selected from the group consisting of aliphatic-aromatic, olefinic hydrocarbon compounds, methane, ethane, ethylene, acetylene, and silicon-organic compounds containing at least one of silicon, carbon, hydrogen, nitrogen and oxygen, tetramethylsilane (TMS), hexamethyldisilane (HMDS), hexamethyldisilazane (HMDS(N)), tetraorthosilicate (TEOS), dimethyldiethoxysilane (DMDEOS), methyltrimethoxysilane (MTMOS), tetramethyldisiloxane (TMDS(O)), divinyltetramethyldisiloxane (VSI2), and hexamethyldisiloxane (HMDS(O)).

6. The method according to claim 1, wherein the wear protection matrix has a layer gradient that provides a gradual change in mechanical properties over a thickness of the wear protection matrix.

7. The method according to claim 6, wherein the layer gradient is based on at least one of stoichiometry or morphology.

8. The method according to claim 6, further comprising the step of:

adjusting a chemical variation of a process gas atmosphere configured about the substrate during the plasma-enhanced chemical vapor deposition process by using at least one of a gas mixture condition and an electrical parameter of irradiated energy.

9. The method according to claim 6, further comprising the step of:

using a multiple-ply layer package to effect a hardness and elasticity adaptation between the substrate and the surface layer in the wear protection matrix.

10. The method according to claim 9 further comprising the step of:

generating a microwave plasma deposition using the plasma-enhanced chemical vapor deposition process and pulsed microwave irradiation.

11. The method according to claim 1 further comprising the step of:

generating the plasma from the plasma-enhanced chemical vapor deposition process by at least one of a microwave excitation and electrical excitation.

12. The method according to claim 1, wherein the bias voltage is pulsed.

13. The method according to claim 1, wherein the at least one optically functional material is incorporated using a physical vapor deposition technique.

14. The method according to claim 1, wherein the Physical Vapor Deposition technique is a sputtering method.

15. The method according to claim 14, wherein the sputtering method is effected by a hollow-cathode source.

16. The method according to claim 1, wherein the at least one optically functional material is selected from the group consisting of oxides, silicides, carbides, borides, nitrides, sulfides, fluorides, selenides, and tellurides of the elements of the fourth through sixth subgroup, the elements La, Ce, Zn, In, Sn, Al, Si, Ge, Sb, Bi, and mixtures thereof.

17. The method according to claim 16, further comprising the step of:

effecting a sputtering of the surface layer using a target that contains the at least one optically functional material.

18. The method according to claim 17, wherein the sputtering of the target includes igniting at least one of a noble gas plasma, an oxygen plasma, a nitrogen plasma and a plasma mixture of a noble gas plasma and a reactive gas plasma.

19. The method according to claim 18, wherein said optically functional material post-reacts to obtain a desired stoichiometry in a reactive gas plasma and a monomer plasma.

20. The method according to claim 1, wherein the plasma-enhanced chemical vapor deposition process and the physical vapor deposition technique are performed simultaneously.

21. The method according to claim 1, further comprising the step of:

performing the plasma enhanced chemical vapor deposition process and the physical vapor deposition process successively to form a multi-ply surface layer.

22. The method according to claim 1, wherein the physical vapor deposition technique effects a gradient of at least one of the concentration, stoichiometry, and morphology of the at least one optically functional material in the wear protection matrix.

23. The method according to claim 1, wherein at least one layer of the surface layer is configured to have absorption properties with respect to electromagnetic radiation in an ultraviolet region of a spectrum.

24. The method according to claim 1, wherein the surface layer has at least a first applied layer and a second applied layer so that the first applied layer has a first calculation indices and the second applied layer has a second calculation indices, where the first and second calculation indices are different and are configured to result in reflection of an electromagnetic radiation in an ultraviolet region of a spectrum.

* * * * *